United States Patent [19]

Murayama

[11] Patent Number: 5,409,782
[45] Date of Patent: * Apr. 25, 1995

[54] COMPOSITE FILM

[75] Inventor: Youichi Murayama, Tokyo, Japan

[73] Assignee: Orient Watch Company, Tokyo, Japan

[*] Notice: The portion of the term of this patent subsequent to Jan. 7, 2009 has been disclaimed.

[21] Appl. No.: 155,183

[22] Filed: Nov. 22, 1993

Related U.S. Application Data

[63] Continuation of Ser. No. 670,471, Mar. 11, 1991, abandoned, which is a continuation-in-part of Ser. No. 295,522, Jan. 10, 1989, abandoned.

[30] Foreign Application Priority Data

May 2, 1988 [JP] Japan .................... 63-109479
May 2, 1988 [JP] Japan .................... 63-109480

[51] Int. Cl.⁶ ............................................. B32B 15/04
[52] U.S. Cl. ............................ 428/623; 428/626; 428/627; 428/672; 428/412; 428/457; 428/938; 427/447
[58] Field of Search ............ 428/623, 626, 627, 672, 428/938, 412, 447, 457, 458; 427/250, 255.6, 447, 525, 535

[56] References Cited

U.S. PATENT DOCUMENTS

| | | | |
|---|---|---|---|
| 3,900,320 | 8/1975 | Rolker et al. | 204/30 |
| 4,252,862 | 2/1981 | Nishida | 428/627 |
| 4,315,970 | 2/1982 | McGee | 428/412 |
| 4,559,112 | 12/1985 | Tamamura et al. | 428/447 |
| 4,765,729 | 8/1988 | Taniguchi | 428/412 |
| 4,963,429 | 10/1990 | Norian et al. | 428/457 |
| 5,068,146 | 11/1991 | Nakayama et al. | 428/457 |
| 5,079,101 | 1/1992 | Murayama | 428/623 |
| 5,153,021 | 10/1992 | Litchfield et al. | 427/447 |
| 5,270,082 | 12/1993 | Lin et al. | 427/255.6 |

FOREIGN PATENT DOCUMENTS 219089 12/1983 Japan ................... 428/412

*Primary Examiner*—George Wyszomierski
*Attorney, Agent, or Firm*—Wenderoth, Lind & Ponack

[57] ABSTRACT

The present invention relates to a composite film. More particularly, the present invention relates to a composite compound film and composite compound multilayered film, comprising a metal, an alloy and/or an inorganic substance with an organic substance, which is excellent in decorative properties, protection and functionality. Methods applicable for forming such a composite compound film include the technique of evaporating a metal, an alloy, and/or an inorganic substance and an organic substance, simultaneously exciting the evaporated particles, and causing vapor-deposition in the state of ionized particles, neutral particles or radicals, and a method of sputtering, without excitation, etc. Further, a composite compound film which contains an organic substance can have an excellent color tone, and at the same time, reduces the amounts of a high cost metals, alloys, or inorganic substances, and provides a frictional coefficient lower than that of a film formed from a metal, an alloy or an inorganic substance alone. The film has a wear resistance which can be improved over that of a film comprising only the material of the composite film.

9 Claims, 2 Drawing Sheets

5,409,782

COMPOSITE FILM

This application is a continuation of now abandoned application, Ser. No. 07/670,471, filed Mar. 11, 1991, which in turn is a continuation-in-part of application, Ser. No. 07/295,522, filed Jan. 10, 1989, also now abandoned.

FIELD OF THE INVENTION

The present invention relates to a composite film. More particularly, the present invention relates to a composite film comprising a metal, an alloy and/or an inorganic substance with an organic substance, which composite film is excellent in decorative properties, forms a good protective film, etc.

PRIOR ART

It is common practice to form a vapor-deposited thin film of a metal, an inorganic material or an organic polymer on the surface of a substrate comprising a metal, glass, ceramics or plastics and to use the formed thin film as an insulating film, a reflecting film, an optical thin film, a display element or an electronic device. The known processes for to achieve these purposes include vacuum vapor deposition, sputtering, ion plating, CVD, MOCVD, MBE, etc.

However, these conventional methods for forming a thin film still present problems to be solved to achieve the desired properties and functions.

One of such problems is that the conventional films fail to possess the desired excellence in color tone, corrosion resistance, adhesion, wear resistance and other functional properties, particularly those films to be used for watches and accessories. Furthermore, in order to form such a film by a conventional method, it is necessary to prepare a layer comprising an expensive metal or an alloy thereof, thus resulting in difficulties in preparing a composite film excellent in decorative properties, protective properties, etc. and which can be manufactured at a low cost.

OBJECT OF THE INVENTION

The present invention proposes means to solve these problems by forming a composite film which is composed of a composite compound film, a composite multilayered film or a composite compound multilayered film, comprising a metal, an alloy and/or an inorganic substance added thereto with an organic substance. That is to say, the present invention provides a composite film formed by vapor phase co-deposition of a metal, an alloy, and/or an inorganic substance with an organic substance. It also provides a composite multilayered film formed by vapor-depositing a thin film comprising a metal, an alloy and/or an inorganic substance and an organic polymer by a plasma exciting vapor phase deposition.

DETAILED DESCRIPTION OF THE INVENTION

Figure 1:
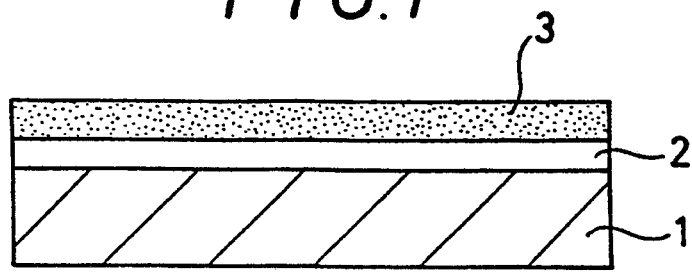
FIG. 1 is a partial sectional view illustrating an embodiment of the composite compound film of the present invention, in which a gold composite compound film is vapor-deposited on a substrate having a previously stacked TiN layer.

As the metal or the alloy in the composite compound film of the present invention, gold and/or at least one metal selected from the group consisting of Cu, Al, Ni, Ag, Zn, Sn, Ta, V, Cr, Co, Pt, Pd, Ru, Rh, Ti, W, Mo, It, Cd, Sb, Hf, Ga, Fe, Y, Ba, Ge, Zr, Nb and In or an alloy thereof is used. As the inorganic substance, TiN, TaN, ZrN, TaC, VN and/or C is employed.

Applicable organic substances include polycarbonates, polyacrylates, polysiloxanes, polyesters, polyolefins, and polyethylene.

Depending upon the material of the substrate on which the composite compound film is to be formed, an undercoat comprising a metal, an alloy, an inorganic substance and/or an organic substance may be formed on the surface of the substrate, and further a composite compound film can be stacked thereon and integrally therewith.

It is also possible to arrange a composite compound film as described above on the surface of a substrate, and stack a top coat comprising a metal, an alloy, an inorganic substance and/or an organic substance thereon and integrally therewith.

Futhermore, it is possible to form an undercoat comprising a metal, an alloy, an inorganic substance and/or an organic substance on the surface of a substrate, stack a composite compound film thereon, and form a top coat comprising a metal, an alloy, an inorganic substance and/or an organic substance thereon and integrally therewith.

Methods applicable for forming such a composite compound film include the technique of evaporating a metal, an alloy, and/or an inorganic substance and an organic substance, simultaneously exciting the evaporated particles, and causing vapor-deposition in the state of ionized particles, neutral particles or radicals, and the method of sputtering, without excitation, etc. In terms of color tone and adhering strength, it is desirable to integrally form the film in the excited state.

In this case, evaporated particles should preferably be excited in a vacuum reactor by glow discharge and be plasma-ionized particles. The methods applicable for plasma-ionization include ion-plating process such as the hollow cathode method and high-frequency excitation, and plasma CVD. For an organic substance, it is also possible to use the method of polymer evaporation or introduction of monomer gas and vapor-depositing it through plasma polymerization.

For excitation, a light radiation such as laser beam could be applied. In adopting the ion-plating method, an inert gas such as argon could be introduced into a vacuum reactor, for example, kept in vacuum at a pressure of from $10^{-2}$ to $10^{-5}$ Torr. Temperature of the substrate could be within the range of from the room temperature to about 400° C. A reactive gas such as oxygen, nitrogen, ammonia, hydrogen carbide, hydrogen sulfide, or hydrogen fluoride can be introduced for vapor deposition by reactive ion-plating. In this case, the gas pressure should preferably be at least $10^{-4}$ Torr.

According to the present invention, as described above, it is possible to achieve a composite compound film excellent in color tone, having satisfactory adhering strength and provided with such functional properties as dielectric properties, conductivity and light response.

In the present invention, the composite compound multilayered film is, for example, formed by vapor-depositing an organic polymer film on the surface of substrate comprising a metal, an alloy, ceramics or plastics, and then sequentially forming a thin film comprising a metal, an alloy and/or inorganic substance, and an organic polymer layer, or formed by vapor-phase depositing a thin film comprising a metal, an alloy and/or an inorganic substance, then an organic polymer film, and subsequently, a thin film comprising a metal, an alloy and/or an inorganic substance.

The thin film comprising a metal, an alloy and/or an inorganic substance in the present invention is, for example, gold, a gold alloy or TiN, and not limited to these examples, may be a metal, an alloy or an inorganic substance having desired color tone and gloss. Examples of the metal or the alloy used in the present invention include such elements as gold, Cu, Al, Ni, Ag, Zn, Sn, Ta, V, Cr, Co, Pt, Pd, Ru, Rh, Ti, W, Mo, Ir, Cd, Sb, Hf, Ga, Si, Fe, Y, Ba, Ge, Zr, Nb and In, or an inorganic substance comprising a compound thereof such as TiN, TaN, ZrN, TaC, VN and/or C.

The organic polymer film in the present invention may be a thin film comprising a polymer such as a polycarbonate, a polyacrylate, a polysiloxane, a polyester, a polyolefin, or polyethylene. In this case, a dye compound or a pigment can be vapor-deposited for coloring.

There is no particular limitation for the substrate, which may be glass, a metal, an alloy, ceramics and plastics.

The thin film comprising a metal, an alloy and/or an inorganic substance and the organic polymer film as listed above are formed by plasma-exciting particles produced through evaporation of the material and vapor-depositing the resultant ionized particles, neutral particles or radicals. It is also possible to form a thin film of a metal or alloy, not by excitation, but by sputtering, etc. However, with a view to largely improving the color tone, the adhering strength and the wear resistance of the composite multilayered film, it is desirable to integrally form it by plasma excitation.

The evaporated particles should preferably be excited by glow discharge in the vacuum reactor for plasma ionization. Means for plasma ionization applicable in this case include ion plating such as the hollow cathode method and the high-frequency excitation method, and plasma CVD. When forming the organic polymer film, plasma excitation can be applied by evaporating the polymer or introducing a monomer gas for vapor deposition. Laser beam excitation could be also applied.

When applying the ion plating method, an inert gas such as argon can be introduced into a vacuum reactor kept in a vacuum at a pressure of, for example, from $10^{-2}$ to $10^{-5}$ Torr. The substrate temperature may be within the range of from room temperature to about 400° C. When forming an inorganic thin film, vapor deposition could be preferably carried out by ion plating through introduction of a reactive gas such as oxygen, nitrogen, ammonia, hydrogen carbide, hydrogen sulfide, or hydrogen fluoride. In this case, the gas pressure should preferably be at least $10^{-4}$ Torr.

According to the present invention, as described above, it is possible to achieve a low-cost composite film excellent in color tone, having a satisfactory adhering strength, and provided with such functional properties as dielectric properties, conductivity and light response.

Now, concrete examples of the present invention will be described. Needless to say, the present invention is not limited to these examples.

EXAMPLE 1

A composite film was formed by an ion plating apparatus based on the high-frequency excitation method. FIG. 1 illustrates this example. A stainless steel sheet was used as the substrate (1). The stainless steel sheet was bombarded by introducing argon gas under a condition of $5 \times 10^{-3}$ Torr, and then a TiN thin film (2) was vapor-deposited by reactive ion plating with nitrogen gas and evaporated Ti particles under a condition of $8 \times 10^{-4}$ Torr. A TiN thin film (2) having a thickness of 0.2 μm was formed by a reaction for three minutes under conditions including a discharge power of 300 W and a substrate temperature of 100° C.

Then, under an argon pressure of $4 \times 10^{-3}$ Torr, evaporated particles of gold and polycarbonate were plasma-ionized to form a composite compound film (3) on the substrate. As a result, a composite compound film (3) having a color tone equal to that of gold was obtained, with a wear resistance about twice as high as that available in the vapor deposition of gold on the substrate. As to adhering strength, no peeloff was observed in a bend test of 90°, and an excellent corrosion resistance was shown.

EXAMPLE 2

Figure 2:
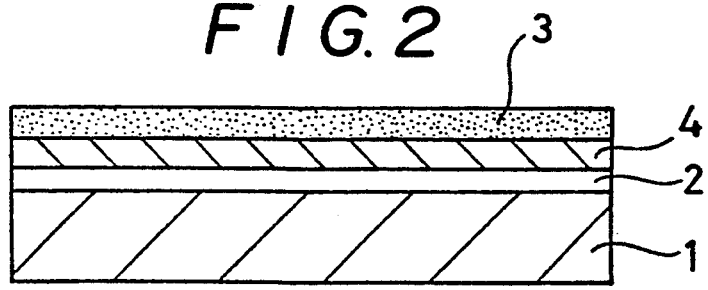
FIG. 2 is a partial sectional view illustrating an embodiment of the present invention, in which an undercoat is made on a TiN layer stacked on a substrate, and a gold composite compound film is formed on the undercoat.

In a manner similar to that in Example 1, a substrate (1) having a titanium nitride thin film (2) formed thereon was used, as shown in FIG. 2, and under an argon pressure of $4 \times 10^{-3}$ Torr, evaporated polycarbonate particles were plasma-ionized. Thus, an undercoat (4) was formed by vapor-depositing a polymer film on the substrate.

Subsequently, a gold-chromium alloy (with a chromium content of 2%) was evaporated together with polycarbonate to form a composite compound film (3) of polycarbonate and gold-chromium alloy with a thickness of about 0.2 μm on the polycarbonate polymerization film.

The thus formed film had a color tone identical with that of a gold-chromium alloy, with excellent adhesion, such that no separation was observed in a 90° bend test, as well as high wear resistance and corrosion resistance.

EXAMPLE 3

Figure 4:
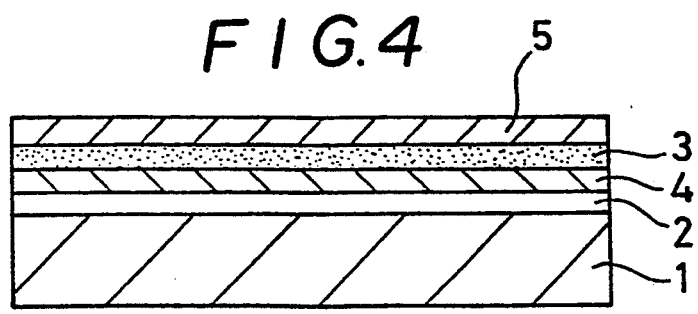
FIG. 4 is a partial sectional view illustrating a case where an undercoat is made on a TiN layer stacked on a substrate, a gold composite compound film being formed thereon, and a top coat is vapor-deposited further thereon.

As in Example 1, a substrate (1) having a titanium nitride thin film (2) formed thereon was used as shown in FIG. 4 and under an argon pressure of $4 \times 10^{-3}$ Torr, evaporated polycarbonate particles were plasma-ionized. Thus, a polymer film was vapor-deposited as the under coat (4) on the substrate.

Then, gold-chromium alloy (with a chromium content of 2%) was evaporated together with polycarbonate to form a composite compound film (3) of polycarbonate and gold-chromium alloy having a thickness of about 0.2 $\mu$m on the polycarbonate polymer film.

Subsequently, evaporation of gold-chromium alloy was discontinued, and polymer film comprising polycarbonate alone having a thickness of about 0.2 $\mu$m was formed as the top coat (5) by vapor deposition on the composite film.

The thus formed film had color tone identical with that of a gold-chromium alloy, with excellent adhesion, such that no separation was observed in a 90° bend test, as well as high wear resistance and corrosion resistance.

EXAMPLE 4

Figure 3:
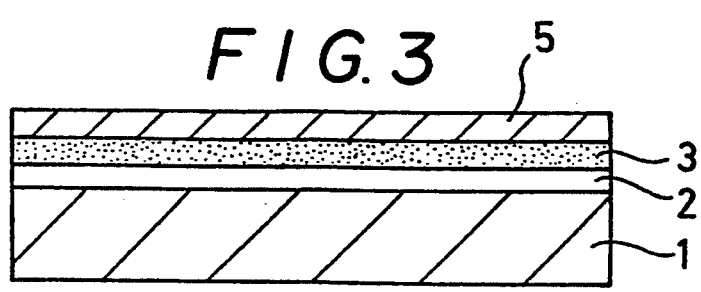
FIG. 3 is a partial sectional view illustrating an embodiment of the present invention, in which a gold composite compound film is formed on a TiN layer stacked on a substrate, and a top coat is vapor-deposited thereon.

As shown in FIG. 3, a polycarbonate polymer film was vapor-deposited as the top coat (5) under an argon pressure of $4 \times 10^{-3}$ Torr on the surface of the composite compound film (3) obtained in Example 1. As a result, a hard transparent polymer film was obtained. This composite compound multilayered film had a color tone identical with that of gold, with a gloss, and had an elegant appearance. This transparent polymer film was excellent in respect to the protection of the composite film, as well as in adhesion, wear resistance and corrosion rsistance as in Example 1.

EXAMPLE 5

Figure 5:
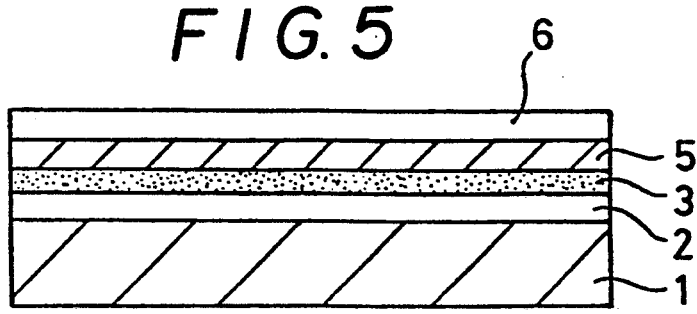
FIG. 5 is a partial sectional view illustrating a case where a transparent conductive film is formed on the surface of the composite compound multilayered film shown in FIG. 3.
Figure 6:
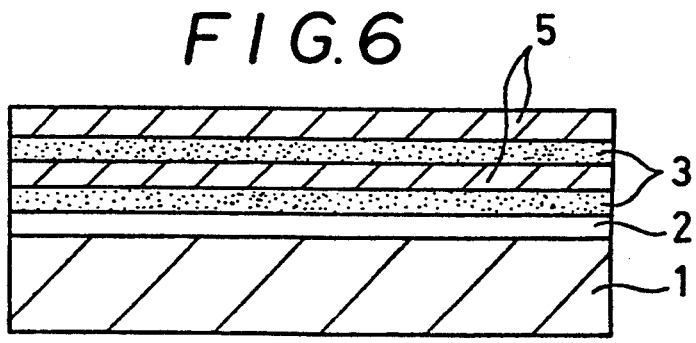
FIG. 6 is a partial sectional view illustrating a case where a composite compound film is formed on the composite compound multilayered film shown in FIG. 3, and FIG. 7 and 8 are sectional views illustrating typical composite films of the present invention.

As shown in FIG. 5, a 0.3 $\mu$m-thick ITO (transparent conductive substance) film (6) was formed on the surface of the composite multilayered film obtained in Example 4, with ITO as the evaporation source under conditions including an oxygen gas pressure of $3 \times 10^{-4}$ Torr, a discharge power of 300 W and a substrate temperature including the composite compound film (3) of Example 4 of 200° C. The thus obtained composite compound multilayered film had a color tone of gold and a gloss, resulting in an elegant appearance. Protection provided by the composite film was further improved, with excellent adhesion, wear resistance and corrosion resistance as in Example 1, and had a surface conductivity (resistance: 200Ω/□).

EXAMPLE 6

Figure 7:
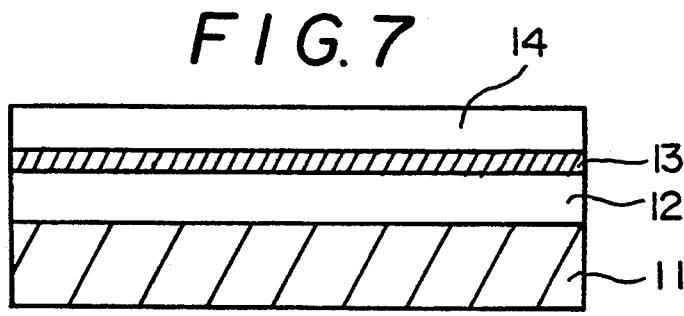

A composite multilayered film was formed by an ion plating apparatus based on high-frequency excitation. As shown in FIG. 7, a stainless steel sheet was used as the substrate (11).

The stainless steel sheet was bombarded by introducing argon gas under the pressure condition of up to a pressure of $5 \times 10^{-5}$ Torr, and then, a TiN thin film (12) was vapor-deposited by reactive ion plating with nitrogen gas and evaporated Ti particles under a pressure of $8 \times 10^{-4}$ Torr. A 0.2 $\mu$m-thick TiN thin film (12) was formed through reaction for three minutes under such conditions, as to include a discharge power of 300 W and a substrate temperature of 100° C.

A polymer film (13) was vapor-deposited by plasma-ionizing evaporated particles of polycarbonate under an argon pressure of $4 \times 10^{-3}$ Torr. Then, a gold thin film (14) was formed through plasma-ionization of evaporated gold particles under an argon pressure of $3 \times 10^{-3}$ Torr.

This resulted in a multilayered film excellent in gold color tone. All properties such as color tone, adhering strength and wear resistance were far superior to those available in the absence of an organic polymer film, and wear resistance was about twices as high.

EXAMPLE 7

A polycarbonate polymer film was vapor-deposited under an argon pressure of $4 \times 10^{-3}$ Torr on the surface of the composite multilayered film obtained in Example 6. A hard transparent polymer film was obtained, with a glossy gold color tone giving an elegant appearance. The film was excellent in protection of the surface.

EXAMPLE 8

A transparent polyacrylate polymer layer and a thin gold film were vapor-deposited on a glass substrate as in Example 6. The gold film showed a satisfactory color tone and wear resistance was about twice as high as that available without vapor deposition of the polyacrylate polymer film.

EXAMPLE 9

Figure 8:
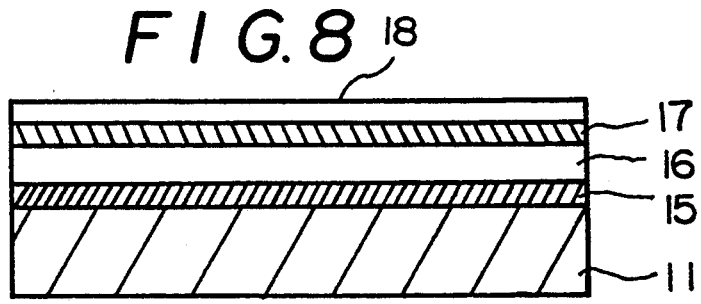

Polycarbonate polymer film (17) and an ITO (transparent conductive substance) film (18) were sequentially vapor-deposited on the surface of the multilayered film comprising a polyacrylate polymer film (15) and a thin gold film (16) obtained in Example 6, as shown in FIG. 8. The resultant composite multilayered film had a color tone of gold and a satisfactory surface conductivity (resistance : 200Ω/□).

The ITO thin film was formed, with ITO as the evaporation source, under conditions including an oxygen pressure of $3 \times 10^{-4}$ Torr, a discharge power of 300 W, and a substrate temperature of 30° C. It is a 0.3 $\mu$m-thick transparent conductive film.

EXAMPLE 10

A composite compound film was formed by a high-frequency sputtering apparatus. A stainless steel sheet was used as the substrate. After pre-sputtering for about 15 minutes by introducing argon gas under a pressure of $5 \times 10^{-3}$ Torr, nitrogen gas was introduced under a pressure of $5 \times 10^{-4}$ Torr by the use of TiN as the target. Then, argon was introduced up to a pressure of $2 \times 10^{-2}$ Torr, and sputtering was conducted for two hours by applying a high-frequency power of 10 W/cm² to form a TiN film having a thickness of about 0.5 $\mu$m. Subsequently, the target was replaced with Au (containing 1% Cr), and sputtering was conducted for about 10 minutes with a high-frequency power of 2 W/cm² by introducing ethylene ($C_2H_4$) up to $1 \times 10^{-4}$ Torr and adding argon gas up to $5 \times 10^{-3}$ Torr. A composite compound film comprising gold-chromium alloy and ethylene was thus obtained, having a gold color tone, being excellent both in adhesion and corrosion resistance.

EXAMPLE 11

A composite compound multilayered film was formed by a high-frequency ion plating apparatus. A nickel-plated brass sheet was used as the substrate. After introducing argon gas up to $5 \times 10^{-4}$ Torr, ion bombardment was conducted at a high-frequency power of 500 W and DC electric field of −200 V for about 15 minutes. Then, titanium was evaporated by an electron gun, by introducing argon gas up to $8 \times 10^{-4}$ Torr, under discharge conditions including a high-frequency power of 500 W, a DC electric field of −200 V, to form a TiN film having a thickness of about 1 μm in 30 minutes. Subsequently, the substrate was transferred to a high-frequency sputtering apparatus, in which sputtering was conducted for about 10 minutes, with Au (containing 1% Cr) as the target, by introducing ethylene ($C_2H_4$) up to $1 \times 10$ Torr and adding argon gas up to $5 \times 10^{-3}$ Torr with a high-frequency power of 2 W/cm² to obtain a composite compound film comprising gold-chromium alloy and ethylene. The resultant film had a gold color tone and was excellent both in adhesion and as in corrosion resistance.

EXAMPLE 12

A composite compound film was formed by a high-frequency sputtering apparatus. A nickel-plated brass sheet was used as the substrate. After sputtering for about 15 minutes by introducing argon gas up to $5 \times 10^{-3}$ Torr, nitrogen gas of $5 \times 10^{-4}$ Torr was introduced, with a TiN target, and then, sputtering was carried out for two hours with a high-frequency power of 10 W/cm² by introducing argon up to $2 \times 10^{-2}$ Torr to from a TiN film having a thickness of about 0.5 μm. Subsequently, the substrate was transferred to an ion plating apparatus, in which gold (containing 1% Cr) was evaporated in a resistance-heating type boat under discharge with a high-frequency power of 40 W by introducing ethylene gas to $4 \times 10^{-4}$ Torr, and a composite film comprising gold-chormium alloy and ethylene having a thickness of about 1 μm was formed in 10 minutes. The formed film was excellent in adhesion, wear resistance and corrosion resistance.

EXAMPLE 13

A composite compound film was formed by a high-frequency ion plating-apparatus. A glass plate (corning 7059) was used as the substrate. After ion bombardment conducted for 15 minutes under conditions including a high-frequency power of 300 W and a DC electric field of −200 V by introducing argon gas up to $5 \times 10^{-4}$ Torr, butadiene gas was introduced up to $5 \times 10^{-4}$ Tort, and a 1,000 Å composite compound film was formed in about 10 minutes by evaporating germanium in a resistance-heating type boat under discharge of high-frequency power of 50 W. This film showed negative resistance-temperature characteristics and a specific resistance of from $10^{-4}$ to $10^{-5}$ Ω.cm.

EXAMPLE 14

A composite compound film was formed by the a high-frequency ion plating apparatus. A glass plate(-corning 7059) was used as the substrate. After ion bombardment conducted for 15 minutes under conditions including a high-frequency power of 300 W and a DC electric field of −200 V by introducing argon gas up to $5 \times 10^{-4}$ Torr, ethylene gas was introduced up to $5 \times 10^{-4}$ Torr, and a 2,000 Å composite compound film was formed in about 10 minutes by evaporating In (indium) in a resistance-heating type heat under discharge of a high-frequency power of 50 W. This film was transparent and showed negative resistance-temperature characteristics.

EXAMPLE 15

A composite compound film was formed by the a high-frequency ion plating apparatus. An aluminum plate was used as the substrate. After ion bombardment conducted for 15 minutes under conditions including a high-frequency power of 300 W and a DC electric field of −200 V by introducing argon gas up to $5 \times 10^{-4}$ Torr, ethylene gas was introduced up to $5 \times 10^{-4}$ Torr, and a 200 Å composite compound film of Ni-Cr alloy and ethylene was formed in about 10 minutes by evaporating an Ni-Cr alloy in a resistance-heating type boat under discharge of a high-frequency power of 50 W. This film had a temperature coefficient of about ±10 ppm/deg, and a high specific resistance of 500 μΩ.cm, thus permitting use as a high-resistance element.

EFFECTS OF THE INVENTION

As described above in detail, the present invention provides the following industrially useful effects by comprising forming a composite film on a substrate through vapor-phase deposition of metal, an alloy and-/or an inorganic substance and an organic substance, and simultaneously using as required a top coat, an undercoat, or both of a top coat and an undercoat;

1. It is possible to reduce the consumption of a metal, an alloy or an inorganic substance without changing the color tone of the metal, the alloy or the inorganic substance used.
2. The composite compound film having an organic substance can have a frictional coefficient lower than that of a film formed from a metal, an alloy or an inorganic substance alone, and wear resistance can be improved over that of a film comprising only the material of the composite film.
3. In a film formed from a metal, an alloy or an inorganic substance alone, corrosion resistance may be affected by the occurrence of pinholes. In the composite compound film, in contrast, corrosion resistance can be largely improved.
4. The composite film as applied to an article in direct touch with human skin gives less feeling of coldness than in touch with a metal, an alloy or an inorganic substance. Moreover the composite film can prevent an allergy to Ni ion, etc.
5. It is possible to provide the surface a composite film with conductivity, so that conductive films of various color tones can be prepared.

These merits are particularly effective when applying the present invention to an accessory, a watch, glasses and other articles of utility, thus providing a very wide range of applications including display elements using various color tones as part of design thereof.

What is claimed is:

1. A composite compound film having excellent color tone characteristics, gloss characteristics, wear resistance and peel strength so as to be useful as decorative films on various substrates formed by the simultaneous vapor-phase codeposition of an organic compound and at least one member selected from the group consisting of a metal, an alloy and an inorganic substance on a substrate such that said film has a thickness of no greater than about 1 μm, said organic compound being selected from the group consisting of a polycarbonate, a polyacrylate, a polysiloxane, a polyester, a polyolefin or polyethylene, said metal being selected from the group consisting of Au, Cu, Al, Ni, Ag, Zn, Sn, Ta, V, Cr, Co, Pt, Pd, Ru, Rh, Ti, W, Mo, Ir, Cd, Sb, Hf, Ga, Si, Fe, Y, Ba, Ge, Zr, Nb, and In, said alloy being an alloy of said metals, and wherein the inorganic substance is selected from the group consisting of TiN, TaN, ZrN, TaC, VN and C, or mixtures of C and a member selected from the group consisting of TiN, TaN, ZrN, TaC and VN.

2. A composite compound film as in claim 1 in which the substance codeposited with the organic substance is an inorganic material.

3. A multilayered composite compound film comprising a substrate, the composite compound film of claim 1 and at least one coating film selected from an undercoat located under the composite compound film or at least one topcoat stacked on top of the composite compound film, said topcoat and undercoat being each selected from the group consisting of (A) a metal, (B) an inorganic substance and (C) an organic substance.

4. A composite compound multilayered film as in claim 3 in which the topcoat and undercoat are each selected from the group consisting of (A) a metal selected from the group consisting of (1) Au, Cu, Al, Ni, Ag, Zn, Sn, Ta, V, Cr, Co, Pt, Pd, Ru, Rh, Ti, W, Mo, Ir, Cd, Sb, Hf, Ga, Si, Fe, Y, Ba, Ge, Zr, Nb and In, or an alloy thereof and (2) Au and a metal selected from the group consisting of Cu, Al, Ni, Ag, Zn, Sn, Ta, V, Cr, Co, Pt, Pd, Ru, Rh, Ti, W, Mo, Ir, Cd, Sb, Hf, Ga, Si, Fe, Y, Ba, Ge, Zr, Nb and In, (B) an inorganic substance selected from the group consisting of TiN, TaN, ZrN, TaC, Vn and C, or mixtures of C and a member selected from the group consisting of TiN, TaN, ZrN, TaC and Vn and (C) an organic substance selected from the group consisting of a polycarbonate, a polyacrylate, a polysiloxane, a polyester, a polyolefin or polyethylene.

5. A composite compound multilayered film as in claim 3 containing an undercoat stacked between the composite compound film and the substrate.

6. A composite compound multilayered film as in claim 3 containing a topcoat stacked directly above the composite compound film.

7. A composite compound multilayered film as in claim 3 containing an undercoat stacked directly on the substrate, a composite compound film stacked on the undercoat and a topcoat stacked on the composite compound film.

8. A composite film according to claim 1 comprising an organic compound codeposited with Au or an Au alloy.

9. A composite film according to claim 1 which has been formed by a plasma exciting vapor-phase deposition step.

* * * * *

UNITED STATES PATENT AND TRADEMARK OFFICE
CERTIFICATE OF CORRECTION

PATENT NO. : 5,409,782
DATED : April 25, 1995
INVENTOR(S) : Youichi Murayama

It is certified that error appears in the above-indentified patent and that said Letters Patent is hereby corrected as shown below:

Col. 7, line 11, change "1x10" to --$1 \times 10^{-4}$--;

Col. 7, line 28, change "to from a TiN" to --to form a TiN--.

Signed and Sealed this

Twenty-eighth Day of November 1995

Attest:

BRUCE LEHMAN

*Attesting Officer*     *Commissioner of Patents and Trademarks*